United States Patent
Freyman et al.

(10) Patent No.: US 7,848,473 B2
(45) Date of Patent: Dec. 7, 2010

(54) PHASE INTERPOLATOR HAVING A PHASE JUMP

(75) Inventors: Ronald L. Freyman, Bethlehem, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 1577 days.

(21) Appl. No.: 11/020,021

(22) Filed: Dec. 22, 2004

(65) Prior Publication Data

US 2006/0133557 A1 Jun. 22, 2006

(51) Int. Cl.
*H04L 7/04* (2006.01)

(52) U.S. Cl. ........................ 375/362; 375/371; 375/226; 375/375; 708/290; 708/313; 328/158; 327/158; 327/161; 327/156; 327/159; 327/160; 327/162; 327/149; 327/150; 327/153

(58) Field of Classification Search ............. 375/362, 375/375
See application file for complete search history.

(56) References Cited

U.S. PATENT DOCUMENTS

| | | | | |
|---|---|---|---|---|
| 5,315,401 A * | 5/1994 | Okada et al. | ............... | 386/104 |
| 5,451,894 A * | 9/1995 | Guo | ............... | 327/241 |
| 6,108,679 A * | 8/2000 | Iwasaki | ............... | 708/290 |
| 6,204,709 B1 * | 3/2001 | Searle et al. | ............... | 327/231 |
| 6,348,826 B1 * | 2/2002 | Mooney et al. | ............... | 327/270 |
| 6,798,241 B1 * | 9/2004 | Bauer et al. | ............... | 326/40 |
| 7,010,014 B1 * | 3/2006 | Percey et al. | ............... | 375/130 |
| 2001/0009275 A1 * | 7/2001 | Jung et al. | ............... | 257/1 |
| 2001/0026179 A1 * | 10/2001 | Saeki | ............... | 327/147 |
| 2003/0062936 A1 * | 4/2003 | Kennedy et al. | ............... | 327/158 |
| 2004/0183578 A1 * | 9/2004 | Chong et al. | ............... | 327/161 |
| 2004/0223571 A1 * | 11/2004 | Donnelly et al. | ............... | 375/371 |
| 2005/0140416 A1 * | 6/2005 | Rashid | ............... | 327/277 |
| 2006/0002497 A1 * | 1/2006 | Zhang | ............... | 375/355 |
| 2009/0219067 A1 * | 9/2009 | Kizer | ............... | 327/156 |

FOREIGN PATENT DOCUMENTS

WO WO 97/14214 4/1997

* cited by examiner

*Primary Examiner*—Chieh M Fan
*Assistant Examiner*—Siu M Lee
(74) *Attorney, Agent, or Firm*—Ryan, Mason & Lewis, LLP

(57) ABSTRACT

A method and apparatus are disclosed for generating phase controlled data, based on a roaming tap interpolator. The present invention recognizes that roaming tap interpolators have inherent nonlinearities and discontinuities at the boundaries of each interpolation region. A roaming tap interpolator is disclosed that shifts the interpolation curve in time in order to avoid the undesired artifacts in the interpolation curve. A roaming tap interpolator generally comprises a plurality of delay elements that delays a first signal to generate a plurality of interpolation regions each having an associated phase; a multiplexer to select one or more of the interpolation regions; and an interpolator to process the selected one or more of the interpolation regions to generate a second signal. In addition, according to the present invention, the roaming tap interpolator includes a delay unit that selectively delays one or more of the first signal and the second signal to generate an interpolation signal, the interpolation signal selectively having a first phase or a second phase.

20 Claims, 4 Drawing Sheets

PHASE INTERPOLATOR HAVING A PHASE JUMP

CROSS-REFERENCE TO RELATED APPLICATIONS

The present invention is related to U.S. patent application Ser. No. 10/999,900 entitled, "Voltage Controlled Delay Loop and Method with Injection Point Control," and U.S. patent application Ser. No. 10/999,889 entitled, "Voltage Controlled Delay Loop With Central Interpolator," each filed on Nov. 30, 2004, and U.S. patent application Ser. No. 11/020,022 entitled, "Trimming Method and Apparatus for Voltage Controlled Delay Loop With Central Interpolator," filed contemporaneously herewith and each incorporated by reference herein.

FIELD OF THE INVENTION

The present invention is related to techniques for clock and data recovery (CDR) techniques and, more particularly, to interpolation techniques for generating a clock signal of a desired phase for such CDR applications.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases. In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). For example, published International Patent Application No. WO 97/14214, discloses a compensated delay locked loop timing vernier. The disclosed timing vernier produces a set of timing signals of similar frequency and evenly distributed phase. An input reference clock signal is passed through a succession of delay stages. A separate timing signal is produced at the output of each delay stage. The reference clock signal and the timing signal output of the last delay stage are compared by an analog phase lock controller. The analog phase lock controller controls the delay of all stages so that the timing signal output of the last stage is phase locked to the reference clock. Based on the results of the oversampled data, the internal clock is delayed so that it provides data sampling adjusted to the center of the "eye." The phase of the VCDL is adjusted to keep up with phase deviations of the incoming data.

Voltage controlled delay loops often require a clock signal with a controllable phase to peform a number of functions, such as margining and trimming. For example, voltage controlled delay loops employ a number of delay stages that typically employ transistor technology. Such transistors may not be evenly matched, and trimming of the delay stages may be required. Thus, a clock signal with a controllable phase is required to trim each of the delay stages. The phase control function, however, typically introduces nonlinearities and discontinuities into the clock signal that have an adverse effect on the accuracy of the trimming function. A need therefore exists for a clock signal with a controllable phase that exhibits improved linearity and continuity characteristics.

SUMMARY OF THE INVENTION

Generally, a method and apparatus are disclosed for generating phase controlled data, based on a roaming tap interpolator. The present invention recognizes that roaming tap interpolators have inherent nonlinearities and discontinuities at the boundaries of each interpolation region. A roaming tap interpolator is disclosed that shifts the interpolation curve in time in order to avoid the undesired artifacts in the interpolation curve. A roaming tap interpolator generally comprises a plurality of delay elements that delays a first signal to generate a plurality of interpolation regions each having an associated phase; a multiplexer to select one or more of the interpolation regions; and an interpolator to process the selected one or more of the interpolation regions to generate a second signal. In addition, according to the present invention, the roaming tap interpolator includes a delay unit that selectively delays one or more of the first signal and the second signal to generate an interpolation signal, the interpolation signal selectively having a first phase or a second phase.

In one exemplary implementation, the delay unit comprises at least one delay element and a multiplexer. The multiplexer selects an input to the delay element or a delayed version associated with an output of the delay element. The delay unit can process an input to the roaming tap interpolator to produce the first signal, or an output of the roaming tap interpolator to selectively delay the second signal.

A more complete understanding of the present invention, as well as further features and advantages of the present invention, will be obtained by reference to the following detailed description and drawings.

DETAILED DESCRIPTION

Figure 1:
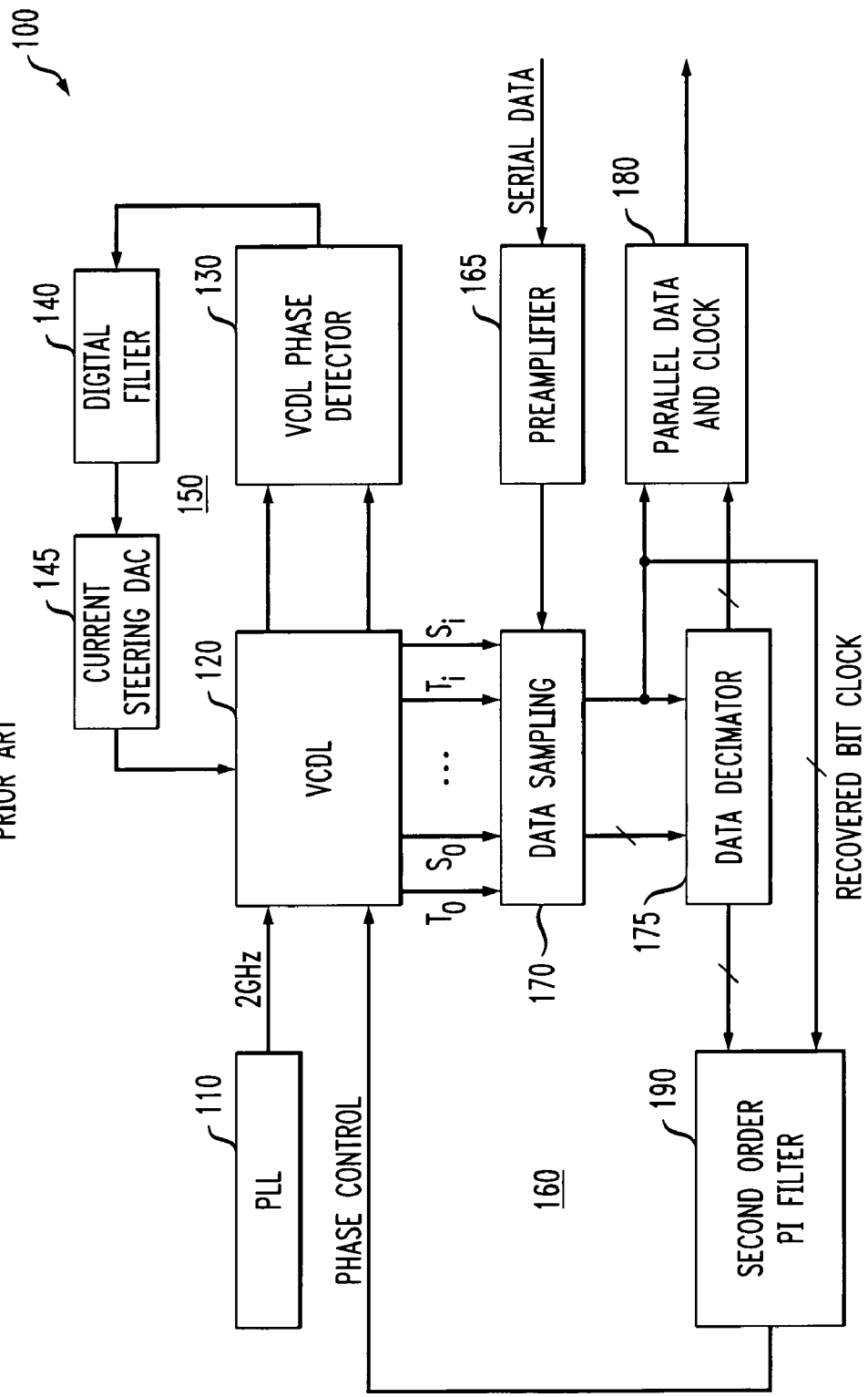
FIG. 1 illustrates an exemplary conventional clock recovery circuit.

The present invention provides a phase interpolator that provides a clock signal with a controllable phase that exhibits improved linearity and continuity characteristics. FIG. 1 illustrates an exemplary conventional clock recovery circuit 100. As shown in FIG. 1, the clock recovery circuit 100 produces a clock signal with a predetermined number of phases, $T_0, S_0, \ldots T_t, S_t$, discussed below in conjunction with FIG. 2. The exemplary clock recovery circuit 100 includes a reference clock signal (2 GHz) generated by a phase locked loop (PLL) 110 and applied to the input of a voltage controlled delay line 120. As shown in FIG. 1, the voltage controlled delay loop 120 interacts with two control loops 150, 160. The first phase control loop 150 is comprised of a VCDL phase detector 130, a digital filter 140 and a current steering DAC 145. Generally, the first control loop 150 adjusts the delays of the voltage controlled delay loop 120. The reference signal and the output of the VCDL 120 are applied to the VCDL phase detector 130 which provides phase detection by producing an output representative of the phase difference that is applied to a filter 140 whose digital output is converted to an analog current by the DAC 145 to control the delay in the stages of the voltage controlled delay loop 120.

The second data control loop 160 is comprised of a preamplifier 165, a data sampling block 170, a data decimator 175, a parallel data and clock output block 180 and a second order proportional and integral (PI) filter 190. The serial data is received and amplified by the preamplifier 165 and applied to the data sampling block 170. The data sampling block 170 samples the data using the plurality of phases, $T_0$, $S_0$, ... $T_i$, $S_i$. The data samples are then applied to the optional data decimator 175 that drops the data rate, for example, by a factor of two. In addition, the data sampling block 170 provides a recovered bit clock output that is applied to the data decimator 175, parallel data and clock output block 180 and second order PI filter 190. The parallel data and clock output block 180 outputs the sampled serial data and clock signal as parallel data (usually 16 or 20 bit wide). The second order PI filter 190 interprets the transition and sample information associated with the, $T_0$, $S_0$, ... $T_i$, $S_i$ samples to generate phase control information for the VCDL 120. Generally, the phase control information ensures that the transitions are maintained close to the transition points (see FIG. 2).

Figure 2:
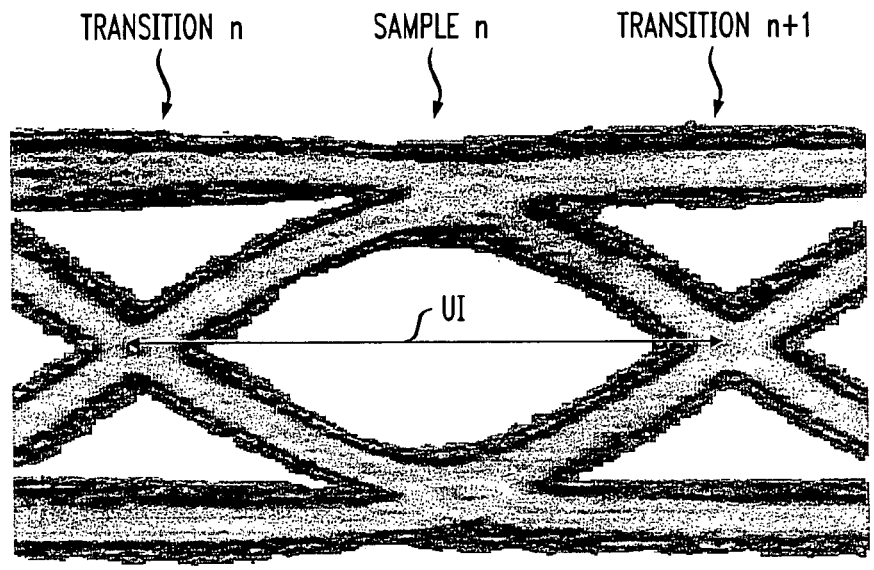
FIG. 2 illustrates the transitions in a data stream.

FIG. 2 illustrates the transitions in a data stream 200. As shown in FIG. 2, the data is ideally sampled in the middle between two transition points. The phases $T_i$, $S_i$ generated by the VCDL 120 are adjusted to align with the transitions and sample points, respectively. Thus, the internal clock is delayed so that the data sampling is adjusted to the center of the "eye," in a known manner.

Figure 3:
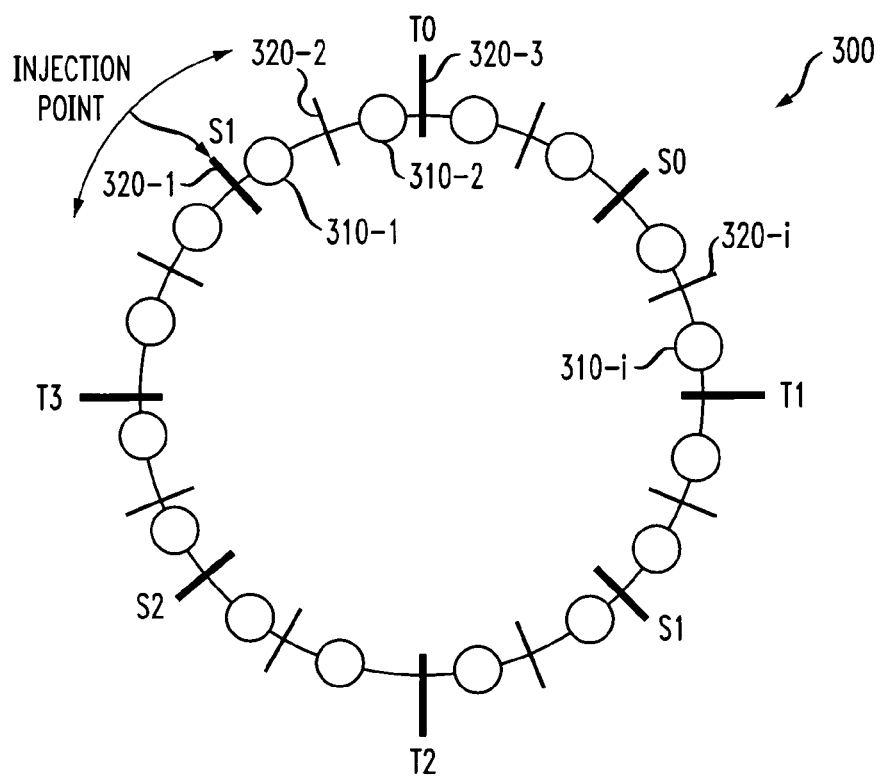
FIG. 3 illustrates a VCDL having coarse phase control.

FIG. 3 illustrates a VCDL 300 having coarse phase control. As shown in FIG. 3, the exemplary VCDL 300 is generally comprised of a succession of 16 delay elements 310-1 through 310-16 interconnected in a loop. The exemplary VCDL 300 also includes 16 inputs 320-1 through 320-16 that are each connected to an associated delay line 310-i. The correlation between the various phases $T_i$, $S_i$ generated by the VCDL 300 to the delay elements 310 is also shown in FIG. 3. As shown in FIG. 3, the injection point where the PLL signal is applied to the VCDL can be shifted to any input 320-i.

The delay stages in the voltage controlled delay loop 300 are typically implemented in integrated circuit technology, leading to an inherent mismatch between delay stages. In FIG. 3, this mismatch leads to nonlinearity of the delay as a function of the injection point, resulting in reduced jitter tolerance.

The embodiment of FIG. 3 moves the injection point by one full delay element, thereby producing significant quantization noise in the VCDL 300. In the exemplary embodiment of FIG. 3, with four delay elements per unit interval (UI), the quantization noise would be +/−¼ UI, which limits the jitter tolerance of the CDR to ½ UI. Thus, the movement of the injection point may not be fine enough to provide the necessary precision in the phase adjustment. In order to resolve this problem, a phase interpolator can be used. The interpolator provides a fractional delay between the output phases from the delay elements. United States Patent Application, entitled "Voltage Controlled Delay Loop with Central Interpolator," filed on Nov. 30, 2004, discloses voltage controlled delay loops employing a central interpolator to provide "fine" phase control. The central interpolator provides a fractional delay that can be increased or decreased before injection into a selected input 320-i of the voltage controlled delay loop 300.

The central interpolator, having one or more delay stages itself, also introduces non-linearity to the delay adjustment. In addition, the central interpolator allows for a trim scheme that allows the delay stages of the voltage controlled delay loop 300 to be trimmed to the delay of the central interpolator. United States Patent Application, entitled "Trimming Method and Apparatus for Voltage Controlled Delay Loop with Central Interpolator," filed contemporaneously herewith, discloses a trimming method that allows the delay stages of the voltage controlled delay loop 300 to be trimmed to the delay through the central interpolator. The trimming method requires a source of phase controlled data. The phase controlled data can be used instead of the serial data so that data sampling latches can be timed and compared against the expected latching time.

Figure 4:
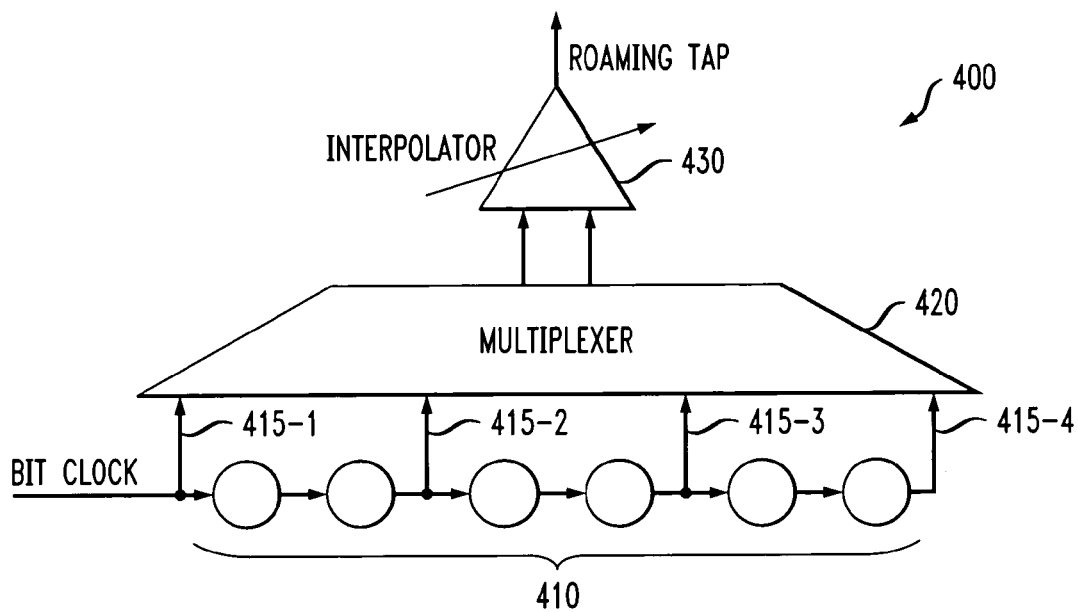
FIG. 4 is a schematic block diagram of an exemplary roaming tap interpolator.

FIG. 4 is a schematic block diagram of an exemplary roaming tap interpolator 400. The roaming tap interpolator 400 may be employed, for example, as the source of phase controlled data for the trimming of voltage controlled delay loops. As shown in FIG. 4, the roaming tap interpolator 400 receives a reference clock signal, such as a bit clock, for example, from a PLL, that is applied to a delay bank 410. The delay bank 410 is comprised of a number of delay elements. The delay elements in the delay bank 410 produce multiple clock phases which can be interpolated so that the Roaming Tap can be moved to any phase within the period of the Bit Clock.

Interpolation gives the best result when interpolated clock phases are close. Thus, the Bit Clock period is typically divided into several regions. In the exemplary embodiment shown in FIG. 4, the delay bank 410 can be tapped at four different locations, 415-1 through 415-4, to provide four corresponding interpolation regions.

Each region is separately selected by a multiplexer 420 and separately interpolated by the interpolator 430, in a known manner. When the boundary of an interpolation region is reached, the roaming tap interpolator 400 switches to the adjacent region. In the exemplary embodiment of FIG. 4, each region of interpolation spans 90° of the Bit Clock, and each delay element in the bank 410 provides a delay of ⅛ of the Bit Clock period.

Figure 5:
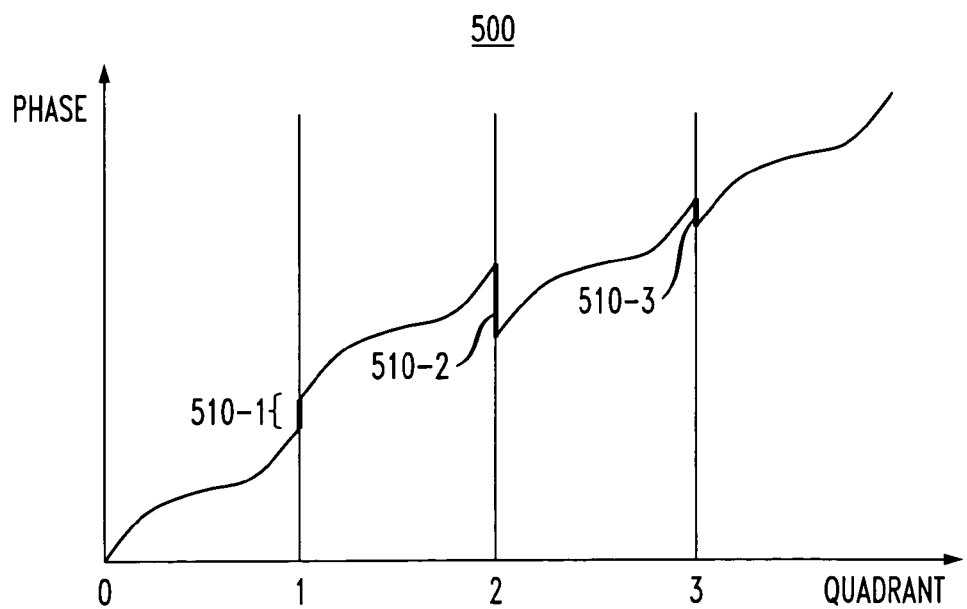
FIG. 5 is a plot that illustrates the phase of the output of the roaming tap interpolator of FIG. 4 as a function of the selected quadrant.

The roaming tap interpolator 400 of FIG. 4 has inherent nonlinearity within each interpolation region. In addition, the roaming tap interpolator 400 demonstrates discontinuity at the boundaries of the interpolation regions. This discontinuity is due to starting and ending points of the interpolator being not equally spaced from the two clock phases used for interpolation. FIG. 5 is a plot 500 that illustrates the phase of the output of the roaming tap interpolator 400 as a function of the selected quadrant (i.e., the interpolation regions). The discontinuities 510-1 through 510-3 occur when switching between quadrants. It is noted that the interpolation steps are not shown to simplify the presentation.

Figure 6:
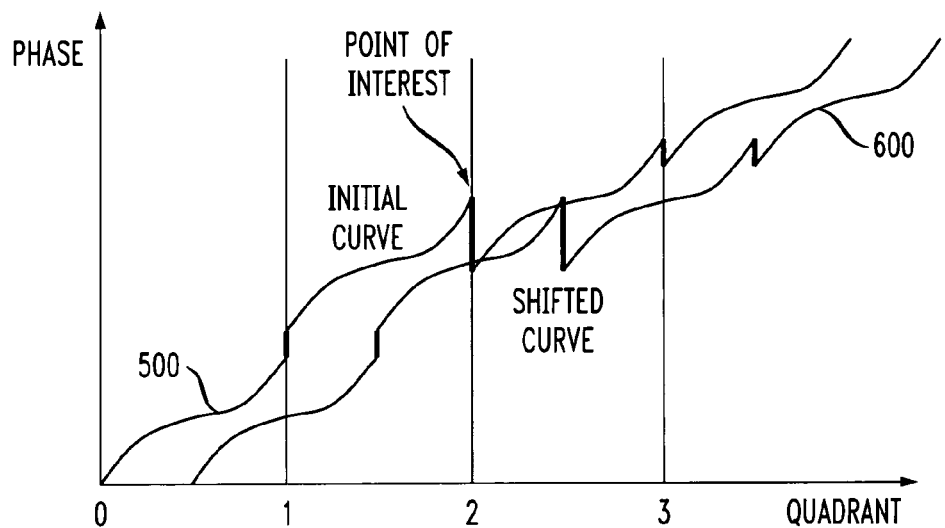
FIG. 6 is a plot that illustrates the time-shifted phase of the output of a roaming tap interpolator as a function of the selected quadrant, in accordance with the present invention.

If the trimming in phase falls close to the discontinuity point 510 or greatest nonlinearity point of the interpolation curve, the trimming result will be impaired. The present invention shifts the interpolation curve in time (in respect to the Bit Clock) in order to avoid the undesired artifacts 510 in the interpolation curve. FIG. 6 is a plot 600 that illustrates the time-shifted phase of the output of a roaming tap interpolator as a function of the selected quadrant, in accordance with the present invention.

Figure 7:
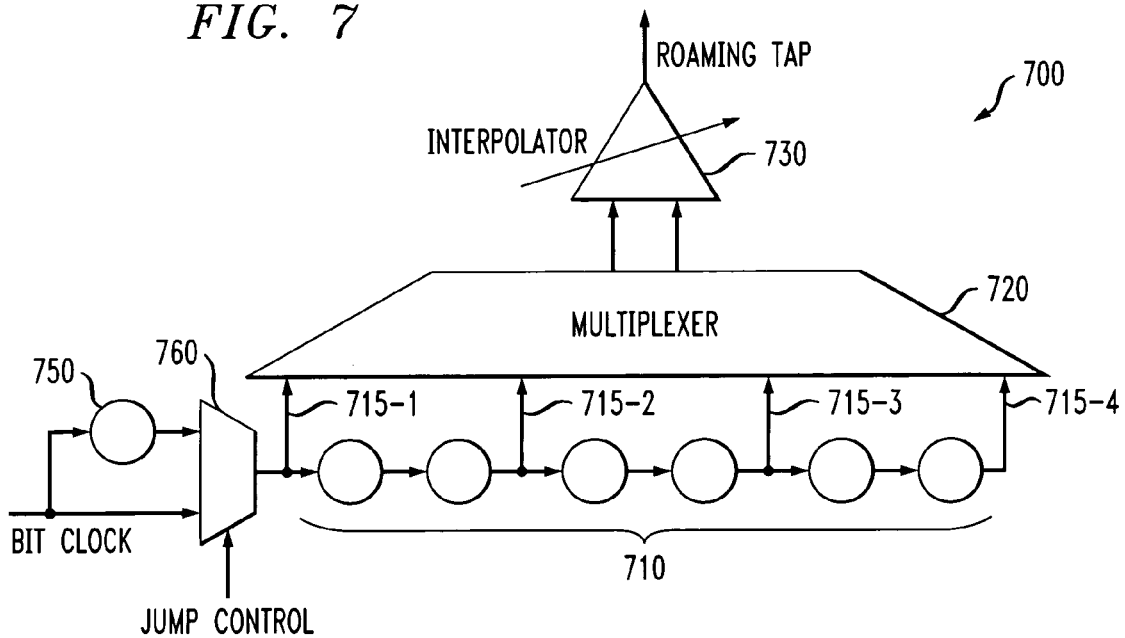
FIG. 7 is a schematic block diagram of an exemplary roaming tap interpolator that provides a phase jump in accordance with the present invention.

FIG. 7 is a schematic block diagram of an exemplary roaming tap interpolator 700 that provides a selective phase jump in accordance with the present invention. The phase jump allows the known points of non-linearity or discontinuity to be avoided. Generally, the interpolation curve shift 600 shown in FIG. 6 can be achieved by an additional delay 750 in front of the interpolation delays bank 710. The delay bank 710, multiplexer 720 and interpolator 730 function in the same manner as described above in conjunction with FIG. 4. The additional delay 750 is controlled by a multiplexer 760 that can select the Bit Clock frequency or the Bit Clock frequency delayed, for example, by ⅛th of the Bit Clock period (thus shifting the interpolation curve by 45°).

It is noted that while the exemplary roaming tap interpolator 700 provides a selective phase jump at its input, the phase jump may alternatively or additionally be provided at the output, as would be apparent to a person of ordinary skill in the art. It is further noted that the phase jump could also be provided at each of the four tap lines 715 or on each of the two lines connecting the multiplexer 720 to the interpolator 730, provided appropriate matching was provided.

It is to be understood that the embodiments and variations shown and described herein are merely illustrative of the principles of this invention and that various modifications may be implemented by those skilled in the art without departing from the scope and spirit of the invention.

We claim:

1. A method for generating a phase controlled data, comprising the steps of
    delaying a first signal to generate a plurality of interpolation regions each having an associated phase;
    selecting one or more of said interpolation regions;
    processing said selected one or more of said interpolation regions to generate a second signal; and
    selectively delaying at least one of said first signal and said second signal to generate an interpolation signal, said interpolation signal selectively having a first phase when said selective delay is applied and a second phase when said selective delay is not applied for avoiding phase discontinuity at the boundaries of the interpolation regions.

2. The method of claim 1, wherein said selective delaying step is performed by at least one delay element and a multiplexer.

3. The method of claim 2, wherein said multiplexer selects an input to said delay element or a delayed version associated with an output of said delay element.

4. The method of claim 1, wherein said selective delaying step is performed prior to said delaying step to generate said first signal.

5. The method of claim 1, wherein said selective delaying step is performed following said processing step to selectively delay said second signal.

6. The method of claim 5, wherein said interpolation regions each span 90° of said first signal.

7. The method of claim 1, wherein said step of delaying a first signal is performed by a plurality of delay elements connected in series.

8. A phase controlled data generator, comprising:
    a roaming tap interpolator comprising:
    a plurality of delay elements that delays a first signal to generate a plurality of interpolation regions each having an associated phase;
    a multiplexer to select one or more of said interpolation regions;
    an interpolator to process said selected one or more of said interpolation regions to generate a second signal; and
    a delay unit to selectively delay at least one of said first signal and said second signal to generate an interpolation signal, said interpolation signal selectively having a first phase when said selective delay is applied and a second phase when said selective delay is not applied for avoiding phase discontinuity at the boundaries of the interpolation regions.

9. The phase controlled data generator of claim 8, wherein said delay unit comprises at least one delay element and a multiplexer.

10. The phase controlled data generator of claim 9, wherein said multiplexer selects an input to said delay element or a delayed version associated with an output of said delay element.

11. The phase controlled data generator of claim 8, wherein said delay unit processes an input to said roaming tap interpolator to produce said first signal.

12. The phase controlled data generator of claim 8, wherein said delay unit processes an output of said roaming tap interpolator to selectively delay said second signal.

13. The phase controlled data generator of claim 8, wherein said interpolation regions each span 90° of said first signal.

14. The phase controlled data generator of claim 8, wherein said plurality of delay elements are connected in series.

15. An integrated circuit, comprising:
    a phase controlled data generator, comprising:
    a roaming tap interpolator comprising:
    a plurality of delay elements that delays a first signal to generate a plurality of interpolation regions each having an associated phase;
    a multiplexer to select one or more of said interpolation regions;
    an interpolator to process said selected one or more of said interpolation regions to generate a second signal; and
    a delay unit to selectively delay at least one of said first signal and said second signal to generate an interpolation signal, said interpolation signal selectively having a first phase when said selective delay is applied and a second phase when said selective delay is not applied for avoiding phase discontinuity at the boundaries of the interpolation regions.

16. The integrated circuit of claim 15, wherein said delay unit comprises at least one delay element and a multiplexer.

17. The integrated circuit of claim 16, wherein said multiplexer selects an input to said delay element or a delayed version associated with an output of said delay element.

18. The integrated circuit of claim 15, wherein said delay unit processes an input to said roaming tap interpolator to produce said first signal.

19. The integrated circuit of claim 15, wherein said delay unit processes an output of said roaming tap interpolator to selectively delay said second signal.

20. The integrated circuit of claim 15, wherein said plurality of delay elements are connected in series.

* * * * *